United States Patent
Cohen et al.

(10) Patent No.: US 10,051,095 B2
(45) Date of Patent: Aug. 14, 2018

(54) LOW Z LINEAR VIBRATOR

(75) Inventors: Sawyer Cohen, Sunnyvale, CA (US);
Ashutosh Yugesh Shukla, Santa Clara, CA (US); Andriy Pletenetskyy, Sunnyvale, CA (US); Nicholas Merz, San Francisco, CA (US); Timothy Michael Johnson, San Jose, CA (US); Yehonatan Perez, Menlo Park, CA (US)

(73) Assignee: APPLE INC., Cupertino, CA (US)

( * ) Notice: Subject to any disclaimer, the term of this patent is extended or adjusted under 35 U.S.C. 154(b) by 606 days.

(21) Appl. No.: 13/183,278

(22) Filed: Jul. 14, 2011

(65) Prior Publication Data

US 2012/0212895 A1     Aug. 23, 2012

Related U.S. Application Data

(60) Provisional application No. 61/445,511, filed on Feb. 22, 2011.

(51) Int. Cl.
| | |
|---|---|
| *H04M 1/00* | (2006.01) |
| *H04M 1/02* | (2006.01) |
| *B06B 1/12* | (2006.01) |
| *H01L 41/09* | (2006.01) |

(52) U.S. Cl.
CPC ............ *H04M 1/026* (2013.01); *B06B 1/12* (2013.01); *H01L 41/09* (2013.01); *Y10T 29/49826* (2015.01)

(58) Field of Classification Search
USPC .......................................... 367/189; 310/325
See application file for complete search history.

(56) References Cited

U.S. PATENT DOCUMENTS

| | | | |
|---|---|---|---|
| 5,682,132 A | 10/1997 | Hiroyoshi et al. | |
| 7,358,633 B2 | 4/2008 | Kweon et al. | |
| 7,583,006 B2* | 9/2009 | Calvet et al. | 310/309 |
| 7,779,707 B2* | 8/2010 | Shih et al. | 73/862.639 |
| 7,911,098 B2 | 3/2011 | Lee et al. | |
| 7,920,694 B2* | 4/2011 | Cruz-Hernandez | G08B 6/00 379/374.03 |
| 8,378,797 B2* | 2/2013 | Pance | G06F 3/016 340/407.1 |
| 8,760,233 B2* | 6/2014 | Steeneken | H03H 9/02259 331/116 M |
| 2002/0011637 A1* | 1/2002 | Kvisteroey et al. | 257/419 |
| 2007/0024155 A1* | 2/2007 | Calvet et al. | 310/309 |

(Continued)

OTHER PUBLICATIONS

Halmai, Attila, and Attila Lukács. "New linear-electromagnetic actuator used for cellular phones." Mechanical Engineering 51.1 (2008): 19-22.*

(Continued)

*Primary Examiner* — James R Hulka
(74) *Attorney, Agent, or Firm* — Brownstein Hyatt Farber Schreck, LLP

(57) ABSTRACT

A low Z linear vibrator is described well suited for use in small form factor portable devices such as a smartphone. The low Z vibrator can be configured to include a beam structure that can be attached to a vibratory mass and a low profile actuator. The low profile actuator can cause the vibratory mass to oscillate in a well-defined and predictable manner.

20 Claims, 10 Drawing Sheets

(56) References Cited

U.S. PATENT DOCUMENTS

| | | | |
|---|---|---|---|
| 2007/0202841 A1* | 8/2007 | Cruz-Hernandez | G08B 6/00 455/403 |
| 2008/0068334 A1* | 3/2008 | Olien | G06F 3/016 345/156 |
| 2009/0145246 A1* | 6/2009 | Shih et al. | 73/862.639 |
| 2009/0167704 A1* | 7/2009 | Terlizzi | G06F 3/016 345/173 |
| 2009/0200880 A1* | 8/2009 | Mortimer et al. | 310/81 |
| 2010/0127581 A1 | 5/2010 | Yun et al. | |
| 2010/0127601 A1* | 5/2010 | Pettersson | 310/331 |
| 2010/0133923 A1* | 6/2010 | Liao et al. | 310/12.02 |
| 2010/0253485 A1* | 10/2010 | Park et al. | 340/407.2 |
| 2011/0006618 A1* | 1/2011 | Lee et al. | 310/25 |
| 2011/0012717 A1* | 1/2011 | Pance | G06F 3/016 340/407.2 |
| 2011/0025426 A1* | 2/2011 | Steeneken | H03H 9/02259 331/155 |
| 2011/0062804 A1 | 3/2011 | Lee et al. | |
| 2011/0181403 A1* | 7/2011 | Cruz-Hernandez | G08B 6/00 340/407.1 |

OTHER PUBLICATIONS

Suybangdum, P., P. Smithmaitrie, and P. Laoratanakul. "Dual piezoelecttic actuators for the traveling wave ultrasonic linear motor." Fourth International Conference on Experimental Mechanics. International Society for Optics and Photonics, 2009.*

Smithmaitrie, Pruittikorn, et al. "Design and performance testing of an ultrasonic linear motor with dual piezoelectric actuators." Ultrasonics, Ferroelectrics, and Frequency Control, IEEE Transactions on 59.5 (2012): 1033-1042.*

* cited by examiner

LOW Z LINEAR VIBRATOR

CROSS-REFERENCE TO RELATED APPLICATION

This application claims priority to and the benefit under 35 U.S.C. 119(e) of U.S. Provisional Patent Application Ser. No. 61/445,511, filed Feb. 22, 2011, entitled LOW Z LINEAR VIBRATOR, the entire disclosure of which is hereby incorporated by reference.

BACKGROUND OF THE INVENTION

Field of the Invention

The present invention relates to generally linear vibrational motors. In particular a low Z profile linear vibrational motor is described.

Related Art

Vibrator motors are used as a sensory feedback device. Vibrators are classified into different types such as iron-core, brushless, flat or pancake and linear vibrators etc. Conventional linear vibrators are configured in such a way that the mechanical vibration produced is due to the displacement of a vibratory mass when directly acted upon by an actuator. Unfortunately, however, due to the direct interaction between the actuator and the vibratory mass, the displacement of the vibratory mass (and therefore the magnitude of the vibration generated) is limited to no more than the displacement provided by the actuator itself. Accordingly, in order to increase the vibration generated by the conventional linear vibrator, the actuator must by necessity provide a greater displacement to the vibratory mass resulting in a larger actuator that may be both inefficient, power-hungry and not well suited for used in small portable devices.

In order to make a thinner (i.e., small Z) linear vibration motor, the dimensions in X and Y of the vibratory body would have to be relatively large predisposing the large, thin vibratory body to vibrational modes in X and Y. These attempts to further reduce the height by flattening the vibratory mass have resulted in instability in both the X and Y directions, commonly causing motor failure. This problem has resulted in a design limit for conventional linear vibrators of roughly 3 mm in height. Another popular design for use in applications requiring a thin configuration is a coin motor (also known as a pancake motor). The coin motor relies on a spinning disc to create vibrations. Unfortunately the necessity of maintaining a circular shape means that any increase in the mass of the disc, without making the device thicker, must be accomplished through an expansion of size in both X and Y directions resulting in a larger overall footprint.

Accordingly, a scalable and efficient vibratory motor suitable for use in small devices is desired.

SUMMARY OF THE DESCRIBED EMBODIMENTS

This paper describes many embodiments that relate to a system, method, and apparatus for the manufacture and implementation of a low Z linear vibrator.

In one embodiment, a low Z linear vibrator is described. The low Z linear vibrator can be used in small form factor devices. In the described embodiment, the low Z linear vibrator includes an actuator arranged to provide an oscillatory actuator force, a vibratory mass of height h and width l, and a beam structure having a width W, a thickness t, and a length E. The beam structure has a first fixed end and an unrestrained second end attached to the vibratory mass. During operation, the actuator directly applies the oscillatory actuator force only to the beam structure at a distance w from the first fixed end causing the beam structure to move a distance±δd. The vibratory mass responds to the movement of the beam structure by the distance±δd by moving a corresponding distance±δZ, wherein the distance±δZ is approximately related to the distance±δd as $$\delta Z = \delta d \frac{W}{w}.$$

In one aspect of the described embodiment, the low Z linear vibrator includes a stiffener attached to at least a portion of the vibratory mass and at least a portion of the beam structure.

In another aspect of the described embodiment the low Z linear vibrator is enlarged by extending the length of the beam structure and vibratory mass. In this way, a plurality actuators can be placed along the axis of extension to support the increased overall device weight.

In another embodiment, a small form factor portable device is described. In the described embodiment, the small form factor portable device includes at least a device housing, a processor arranged to provide instructions to other components, a battery connected to provide power to other components, and a low Z linear vibrator mechanically attached to the device housing that provides sensible feedback in response to instructions from the processor.

In yet another embodiment, a method for installing a low Z vibrator in a small form factor device is described. The method can be carried out by performing at least the following operations: receiving a housing for a small form factor portable device receiving a low Z linear vibrator; and installing the low Z linear vibrator inside the small form factor portable device.

BRIEF DESCRIPTION OF THE DRAWINGS

The invention and the advantages thereof may best be understood by reference to the following description taken in conjunction with the accompanying drawings.

DETAILED DESCRIPTION OF EXAMPLE EMBODIMENTS

Figure 1:
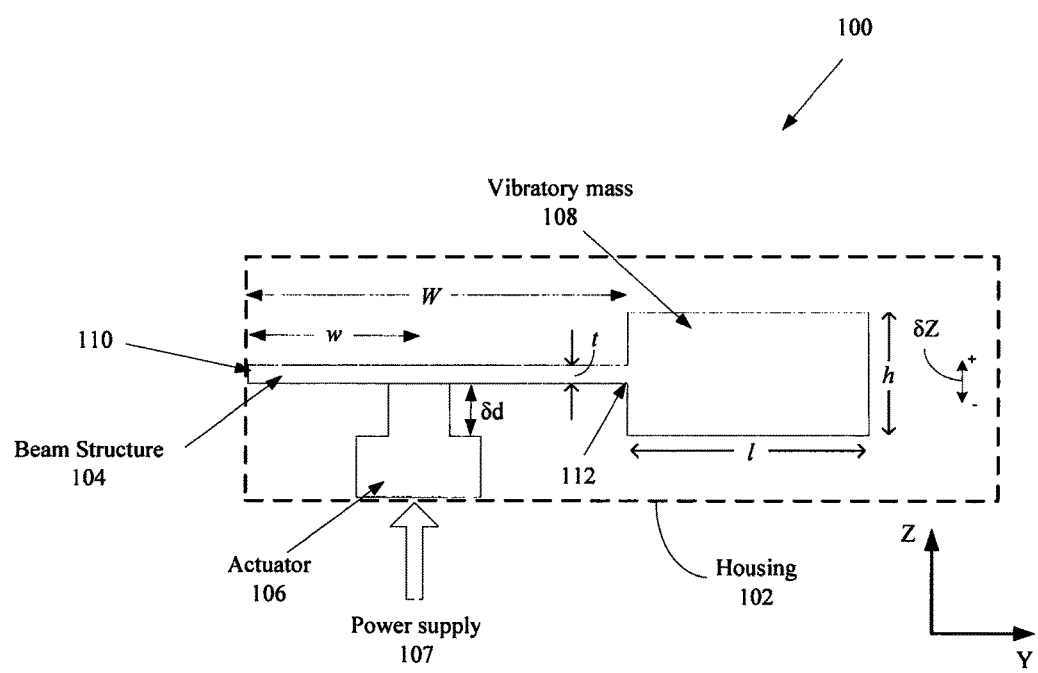
FIG. 1 shows a representative cross section of a low Z linear vibrator in accordance with the described embodiments.

In the following description, numerous specific details are set forth to provide a thorough understanding of the present invention. It will be apparent, however, to one skilled in the art that the presently described embodiments may be practiced without some or all of these specific details.

Conventional linear vibrators are configured in such a way that the mechanical vibration produced is due to the displacement of a vibratory mass when directly acted upon by an actuator. Unfortunately, however, due to the direct interaction between the actuator and the vibratory mass, the displacement of the vibratory mass (and therefore the magnitude of the vibration generated) is limited to no more than the displacement provided by the actuator itself. Accordingly, in order to increase the vibration generated by the conventional linear vibrator, the actuator must by necessity provide a greater displacement to the vibratory mass resulting in a larger actuator that may unnecessarily drain valuable battery life.

The described embodiments relate generally to a mechanism for providing a mechanical output that is both predictable and well defined More specifically, the mechanism can take the form of a thin (also referred to as low Z) linear vibrator well suited for use in a small form factor portable device such as a smartphone along the lines of the iPhone™ manufactured by Apple Inc. of Cupertino, Calif. Other devices in which the low Z linear vibrator can be used can include for example a tablet device such as the iPad™ also manufactured by Apple Inc. The low Z linear vibrator can include a low power, highly efficient actuator that indirectly drives a vibratory mass. In a particular embodiment, the low Z linear vibrator can include a beam structure having a first fixed end and a second end attached to the vibratory mass. In this embodiment, the actuator can be attached to the beam structure such that mechanical energy imparted by the actuator to the beam structure can cause the vibratory mass to undergo vibratory mass displacement δZ that is both well-defined and predictable. Moreover, displacement δZ can be dependent upon a position of the actuator with respect to the vibratory mass. For example, displacement δZ can be increased by moving the actuator away from the vibratory mass. On the other hand, displacement δZ can be decreased by moving the actuator towards the vibratory mass. The low Z linear vibrator has a number of advantages over conventional vibrators. For example, the ability to extend the vibrator in one axis is also a clear improvement over another piece of low Z dimension related art, such as coin motor vibrators. As well known in the art, a coin motor relies on a spinning disc to create vibrations, any increase in mass and therefore vibration strength must be accomplished through an expansion of size in both X and Y directions.

These and other embodiments are discussed below with reference to FIGS. 1-9. However, those skilled in the art will readily appreciate that the detailed description given herein with respect to these figures is for explanatory purposes only and should not be construed as limiting.

FIG. 1 shows a cross section of representative low Z linear vibrator 100 in accordance with the described embodiments. Low Z linear vibrator 100 includes housing 102, beam structure 104, actuator 106 arranged to receive power from power supply 107 and vibratory mass 108. In the described embodiment, vibratory mass 108 can be formed of many suitable materials and possess any number of suitable shapes. In the particular example shown in FIG. 1, vibratory mass 108 can possess a rectangular cross section having length l and height h. In one embodiment, beam structure 104 can have width W and thickness t and can take the form of a beam spring (often commonly referred to as a leaf spring or flat spring) having first end 110 rigidly attached to housing 102 and second end 112 rigidly attached to vibratory mass 108. Actuator 106 is securely attached to beam structure 104 so it can impart force in both the a position (+) and negative (−) Z directions from a nominal position.

Beam structure 104 can be formed of resilient material such as metal that can transfer mechanical energy imparted by actuator 106 to vibratory mass 108 in the form of motion in the ±Z direction without exciting vibratory modes in either the Y or X directions. In this way most of the energy provided by actuator 106 causes vibratory mass 108 to vibrate in the ±Z direction a displacement distance δZ which can be substantially larger than actuator displacement d at a distance w from first end 110. In one embodiment, actuator 106 can take the form of a voice coil motor, or VCM. In another embodiment, actuator 106 can take the form of a solid state transducer. For example, actuator 106 can be implemented at least in part as a piezoelectric motor. In this way, solid state actuator 106 can have a substantially shorter displacement distance thereby permitting solid state actuator 106 to take up less room and consume less power.

Figure 2A:
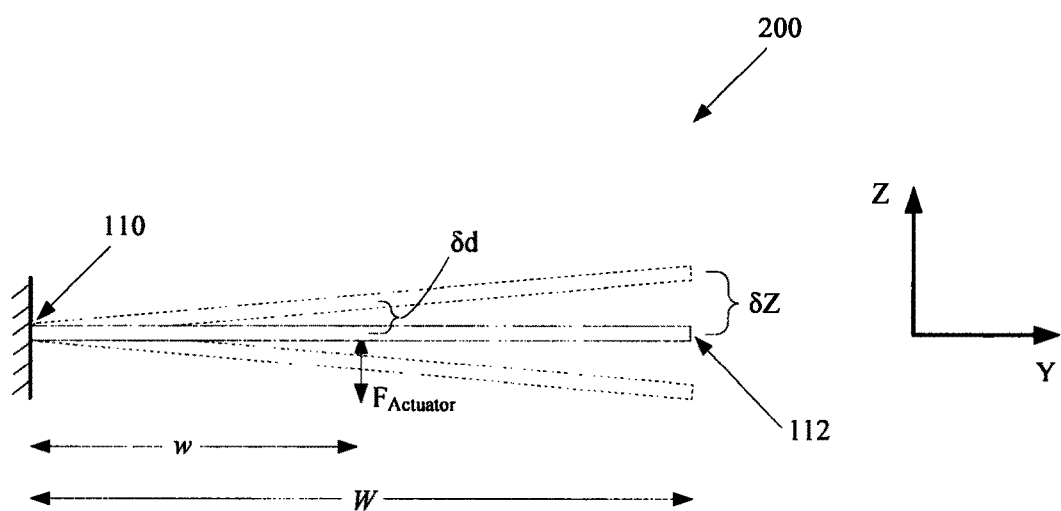
FIG. 2A shows an explanatory diagram for a specific displacement of the beam structure by the actuator.
Figure 2B:
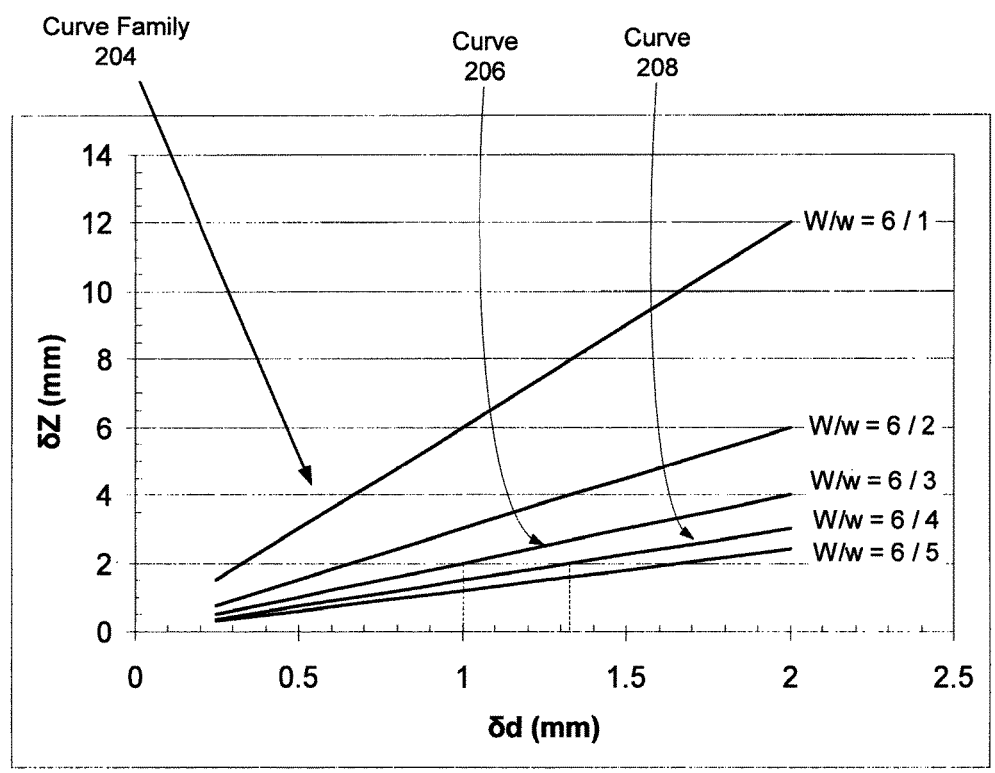
FIG. 2B shows a graph of the movement of the vibratory mass given a certain input by the actuator for five different actuator placements.

FIGS. 2A and 2B graphically illustrate the relationship between actuator displacement δd and vibratory mass displacement δZ. During operation, actuator 106 actuator 106 can generate actuator force $F_{actuator}$ that can be applied directly to beam structure 104 a distance w from fixed end 110. In this way, actuator force $F_{actuator}$ can cause beam structure 104 to move actuator displacement distance δd. Due to the geometric relationship between the position of actuator 106 and vibratory mass 108, vibratory mass displacement δZ is related to a ratio of width W of beam structure 104 and position w of actuator 106 with respect to fixed end 110. In order to simplify this discussion, it can be assumed that beam structure 104 is essentially rigid and therefore does not appreciably flex. In this way, the relationship between vibratory mass displacement δZ and actuator displacement δd can be related to each other simply by the relative ratios of distance w and beam width W according to Eq. (2):

$$\delta Z = \delta d \frac{W}{w}. \qquad \text{Eq. (2)}$$

It can be seen that the amount of vibration of low Z linear vibrator 100 can be varied simply by altering the ratio (W/w). This ratio can be altered in any number of ways. For example, the ratio (W/w) can be altered by changing the position of actuator 106 with respect to vibratory mass 108. On the other hand, by varying beam width W, vibratory mass displacement δZ can also be changed. In this way, the vibration felt by an end used can be widely varied with no appreciable change in size of low Z linear vibrator 100.

FIG. 2B graphically illustrates the relationship between vibratory mass displacement δZ and actuator displacement δd showing family of curves 204 as a function of ratio (W/w). For example, curve 206, having an associated ratio W/w of 6:3, shows that when actuator force $F_{actuator}$ is applied to beam structure 104 midway between attachment point 110 and attachment point 112, a representative actuator displacement δd of about 0.1 mm results in a vibratory mass displacement δZ of about 0.2 mm.

The ability to directly affect the amplitude of δZ by varying the position of actuator 106 allows for a plurality of simple design variations, all having nearly the same height of actuator 106. As δZ increases so does the strength of the vibratory feedback to the end user. By installing a first low Z linear vibrator with actuator position $w_1$ in relation to the first fixed end 110, and a second low Z linear vibrator with actuator position $w_2$ less than $w_1$, variable sensible vibration strengths can be provided. For example, in accordance with Eq. (2), since the ratio (W/w) becomes larger as w decreases, the second low Z linear vibrator with smaller position $w_2$ results in a larger vibratory mass displacement $δZ_2$, and correspondingly larger vibration strength. The low Z linear vibrators of the small form factor portable device with varying vibratory strength could then be applied in combination to create a plurality of vibration patterns for a wide variety of different event notifications.

Figure 3:
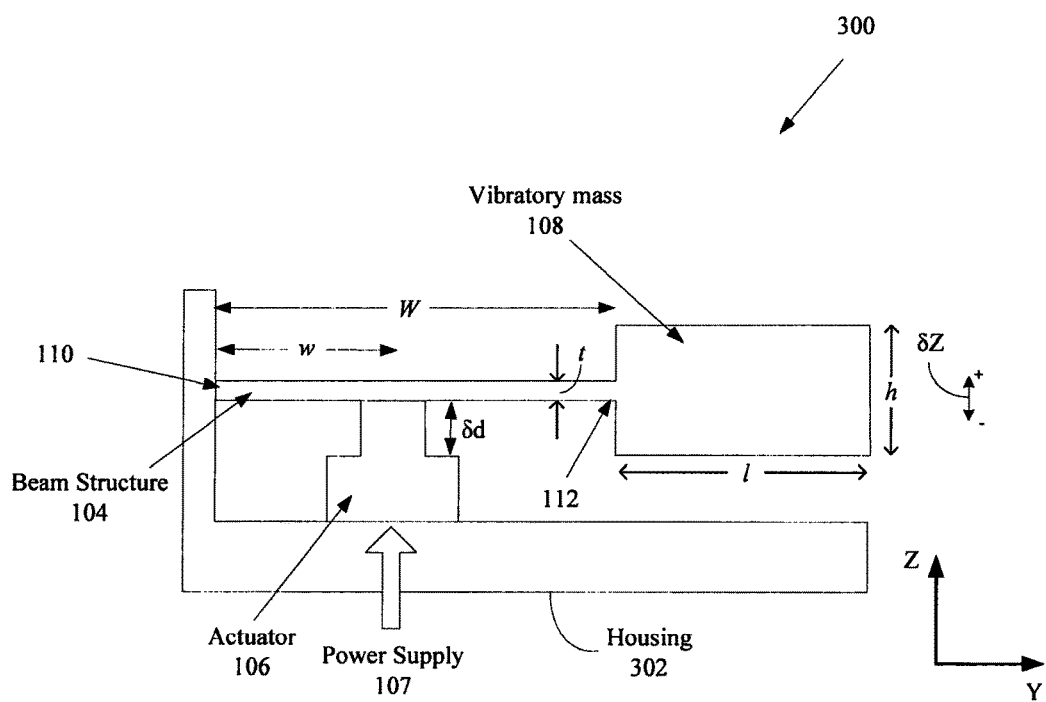
FIG. 3 shows a representative cross section of the low Z linear vibrator of FIG. 1, embedded in the housing of a small form factor device.

FIG. 3 shows embodiment 300 of low Z vibrator 100 arranged in such a way that beam structure 104 can be directly attached at position 110 to housing 302 of a small form factor portable device (not shown) such as a smartphone. In this way, low Z vibrator 300 can have reduced weight and fewer components and thereby is preferable for use in smaller, lightweight portable devices.

Figure 4:
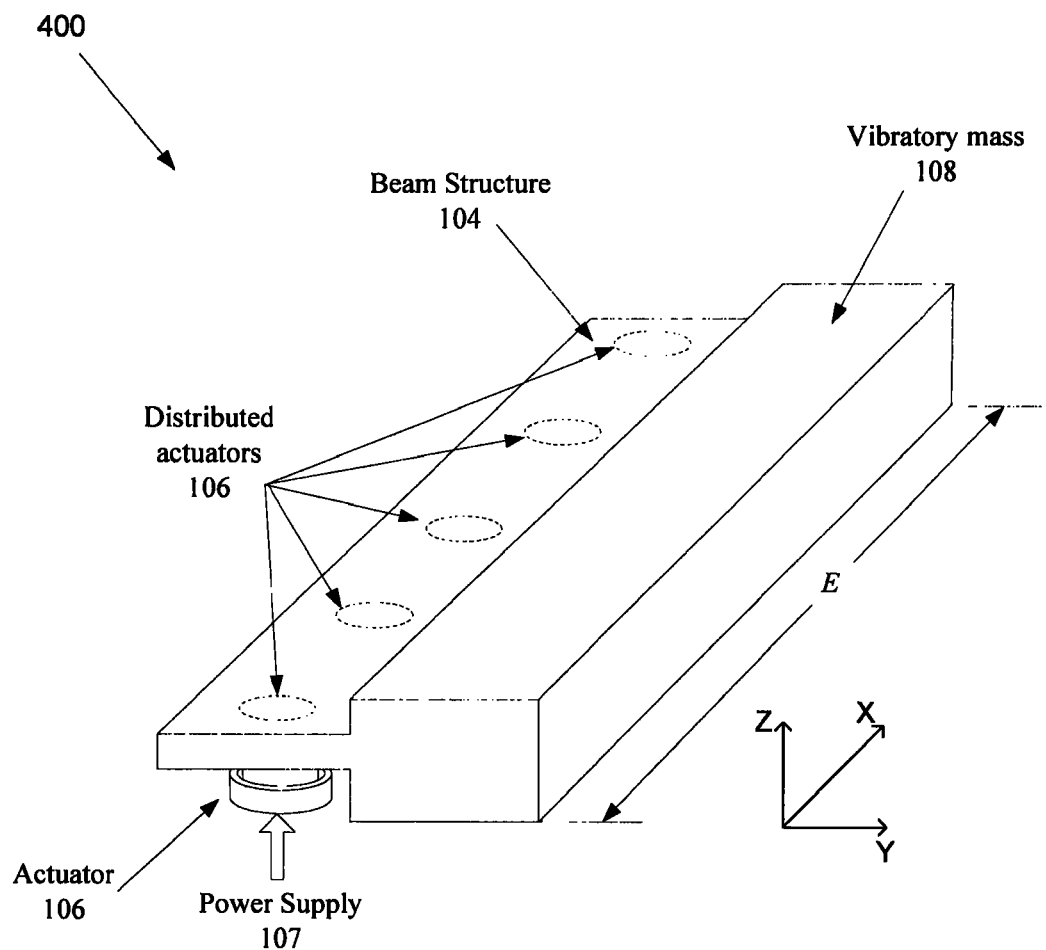
FIG. 4 shows a perspective view of the low Z linear vibrator of FIG. 1 showing distributed actuators in accordance with the described embodiments.

FIG. 4 shows a perspective view of embodiment 400 of low Z linear vibrator 100 having a number of actuators 106 uniformly distributed along beam structure 104 that taken together can be used to drive vibratory mass 108. The distributed actuators 106 can be connected to a single source of power in order to assure synchronous motion of beam structure 104. In some cases, extending beam structure 104 can be desirable. For example, extending length E of beam structure 104, to form an elongated beam structure allows low Z linear vibrator 100 to be easily scaled, in order to accommodate larger, more powerful vibrators.

Figure 5:
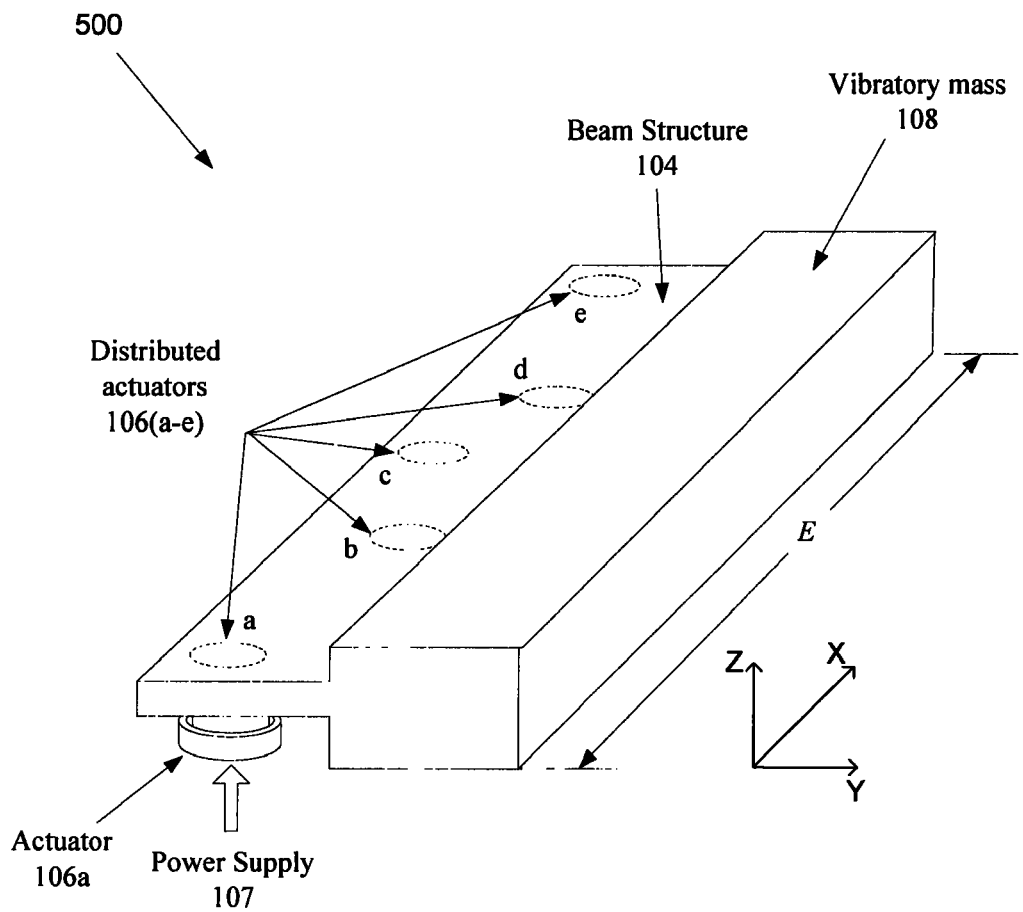
FIG. 5 shows a perspective view of the low Z linear vibrator of FIG. 1, showing actuators placed in an alternative configuration.

FIG. 5 shows an alternate embodiment 500 of low Z linear vibrator 100 where distributed actuators 106 are arranged in at least two discrete distances from vibratory mass 108. This variation would simply require the use of actuators with different displacement distances to compensate for the change in lever arm. For example, FIG. 2B shows that curve 206 and 208 yield the same vibratory mass displacement δZ with actuator displacement δd inputs of 1 mm and 1.32 mm respectively. Furthermore, FIG. 5 shows that due to the rigidity of beam structure 104, there is no need to space the actuators at uniform distances across the x-axis.

Figure 6:
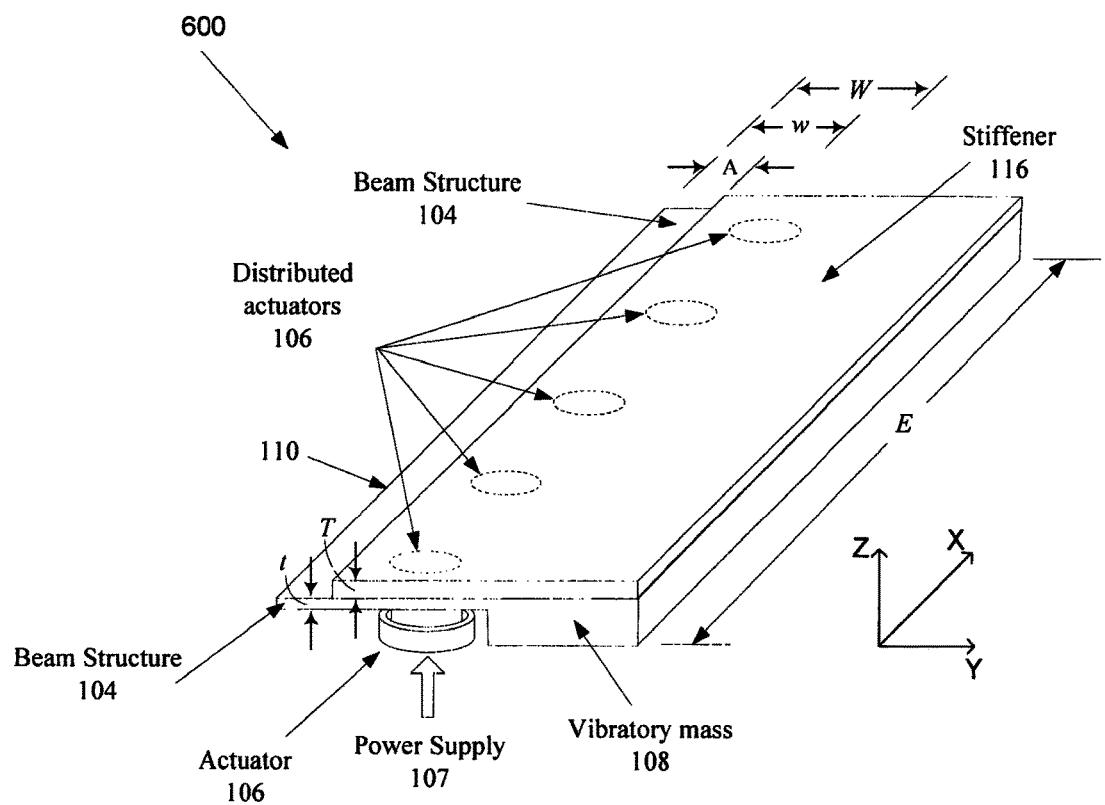
FIG. 6 shows a perspective view of the low Z linear vibrator with the addition of a stiffening layer.

FIG. 6 shows another embodiment 600 of the low Z linear vibrator 100 in accordance with the described embodiments. More specifically, low Z linear vibrator 600 can include at least stiffener 116. Stiffener 116 can be used to further reinforce beam structure 104, helping to prolong longevity by providing support for the otherwise unsupported portion of beam structure 104 between actuator 106 and vibratory mass 108. Stiffener 116 can extend from vibratory mass 108 to at least actuator 106. Stiffener 116 can be any appropriate thickness T. In order to help prevent further stress on embodiment 600 when subjected to changing temperatures, stiffener 116 can be made of a material with similar thermo mechanical properties to beam structure 104 and vibratory mass 108. Furthermore, to further reduce thermal creep problems, vibratory mass 108 and beam structure 104 may be manufactured as a single piece. The depiction of the actuators 106 with uniform alignment and spacing does not limit the implementation of the stiffener 116 to this specific configuration. The actuators 106 may also be arranged in many other configurations, consistent with the FIG. 5 depiction.

Figure 7:
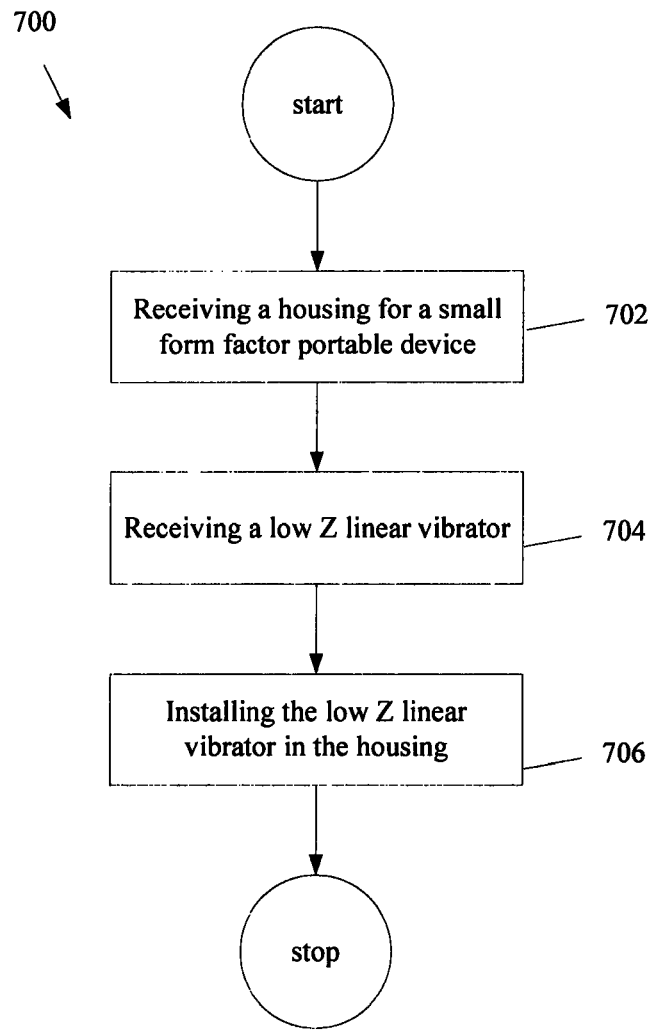
FIG. 7 shows a flowchart describing the method for installing a low Z linear vibrator into a small form factor device.

FIG. 7 shows a flowchart describing process 700 for manufacturing a small form factor device having a low Z linear vibrator in accordance with the described embodiment. Process 700 begins at 702 by receiving a housing for the small form factor portable device. The small form factor portable device can include, for example, smart phones, tablet devices, portable media players, and so on. At 704, a low Z linear vibrator is received and at 706, the low Z linear vibrator is installed within and attached to the small form factor portable device housing.

Figure 8:
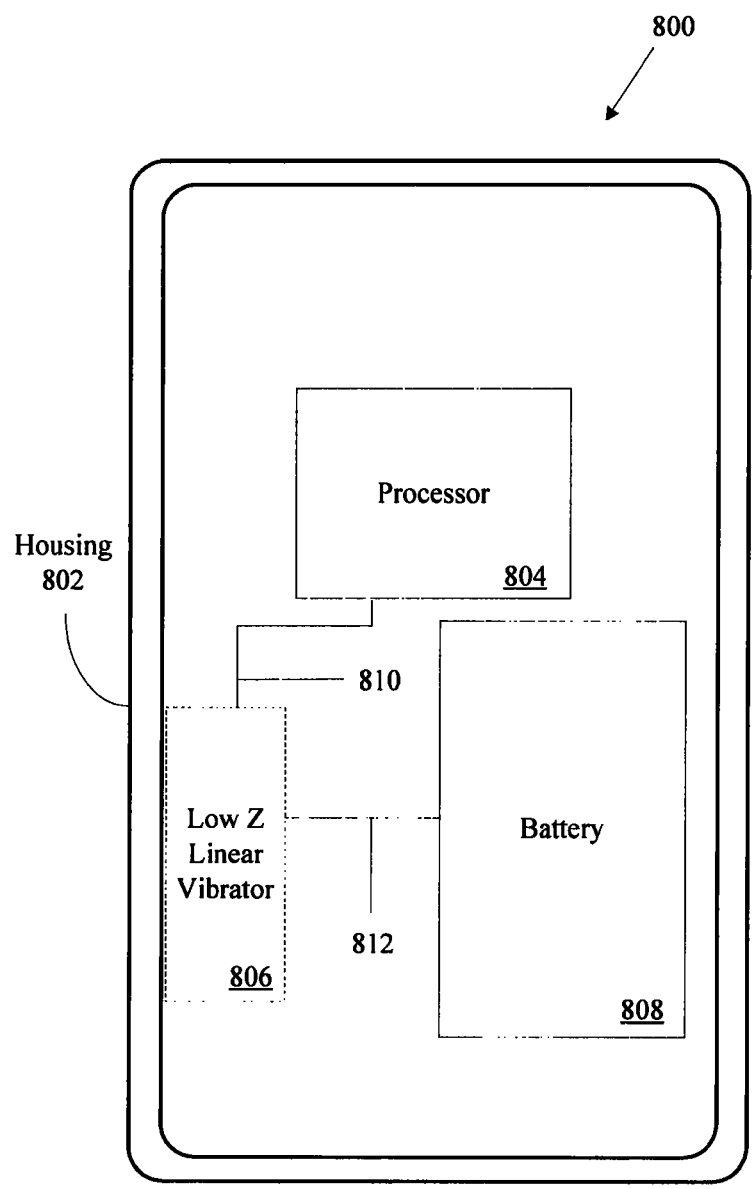
FIG. 8 shows a top view of a small form factor device having a low Z linear vibrator.

FIG. 8 shows representative top view of small form factor device 800 in accordance with the described embodiments. Small form factor device 800 can take many forms such as a smartphone or portable media player. Accordingly, for the remainder of this discussion, small form factor device 800 will take the form of portable media player 800 without loss of generality. As shown, portable media player 800 can include housing 802 that can be used to support a number of components such as processor 804. In this particular configuration, processor 804 can be in communication with low Z linear vibrator 806 that receives power from battery 808 by way of connection 810. In some cases, low Z linear vibrator 806 can include a separate housing that can be mechanically attached directly to housing 802. In other cases, low Z vibrator 806 can include a beam structure (not shown) that can be directly attached to housing 802. In any case, vibrations from low Z linear vibrator 806 can be used to provide information to an end user of portable media player 800. For example, when processor 804 determines that battery 808 is in need of charging, then processor 802 can activate low Z linear vibrator 806 in such a way as to inform the end user. It should be noted, therefore, that vibration patterns provided by low Z linear vibrator 806 can be used to indicate specific information, such as low battery charge to the end user.

Figure 9:
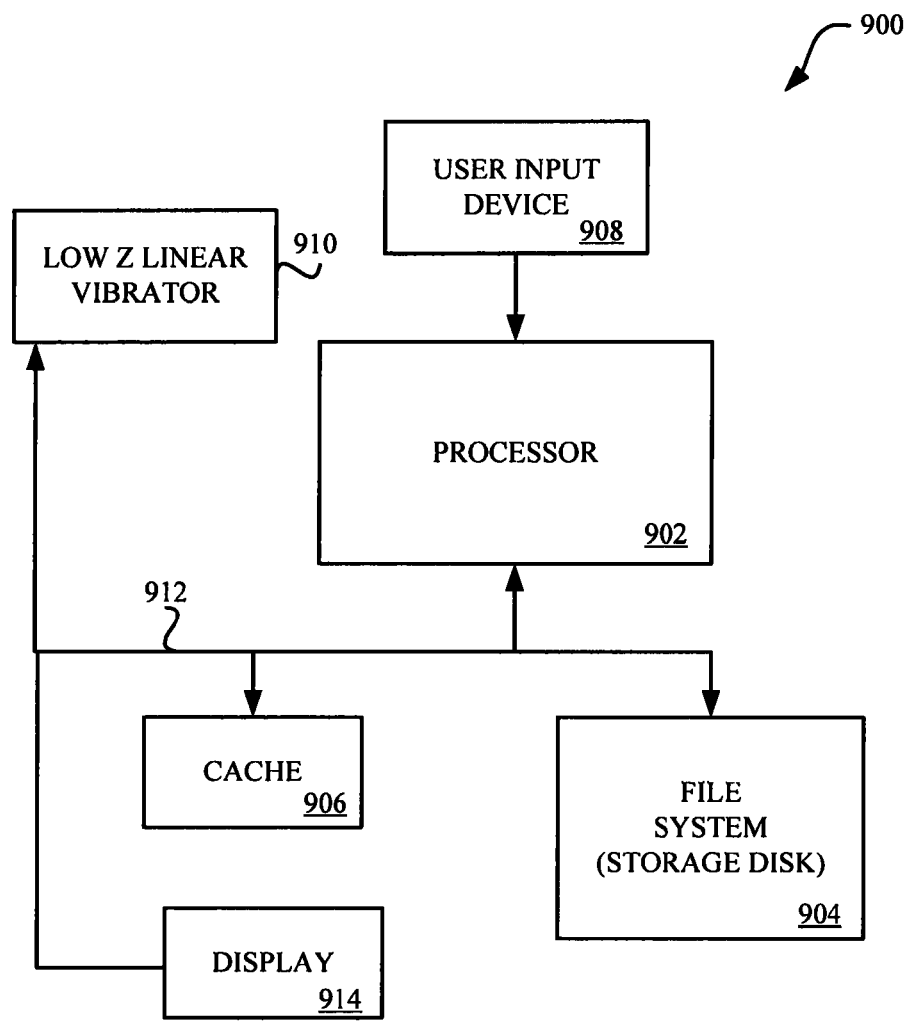
FIG. 9 shows a block diagram describing how the low Z linear vibrator communicates with other common components found in a small form factor device.

FIG. 9 is a block diagram of computing system 900 in accordance with the described embodiments. In accordance with the previous discussion, computing system 900 takes the form of portable media player 900 that can include processor 902 that pertains to a microprocessor or controller for controlling the overall operation of computing system 900. Portable media player 900 stores data pertaining to calendar items, for example, in a file system 904 and a cache 906. The file system 904 is, typically, a storage disk or a plurality of disks. The file system typically provides high capacity storage capability for computing system 900. However, since the access time to the file system 904 is relatively slow, computing system 900 also includes a cache 906. The cache 906 is, for example, Random-Access Memory (RAM) provided by semiconductor memory. The relative access time to the cache 906 is substantially shorter than for the file system 904. However, the cache 906 does not have the large storage capacity of the file system 904. Further, the file system 904, when active, consumes more power than does the cache 906. The power consumption is particularly important when the computing system 900 is a portable media player that is powered by a battery (not shown).

Computing system 900 also includes a user input device 908 that allows a user of computing system 900 to interact with computing system 900. For example, the user input device 908 can take a variety of forms, such as a button, keypad, dial, etc. Still further, the computing system 900 includes data bus 912 which can facilitate data transfer between at least the file system 904, the cache 906, the processor 902, the display 914, and the Low Z Linear Vibrator 910.

In one embodiment, computing system 900 serves to store a plurality of calendar events (e.g., appointments) in the file system 904. When a user desires to have the computing device 900 alert him of a particular event, a calendar view is displayed on display 914. Then, using the user input device 908, a user can schedule a calendar event. The processor 902, upon receiving a selection of a particular calendar item, supplies the scheduling data (e.g., appointment) for the particular event to the file system 904. At preset intervals, processor 902 will place a certain number of upcoming events into cache 906. When the time for the calendar event occurs, the processor 902 directs the Low Z Linear Vibrator 910 to produce a sensible vibratory output to alert the user of the event, at which point display 914 can then provide the user with event details.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the invention. Thus, the foregoing descriptions of specific embodiments are presented for purposes of illustration and description. They are not intended to be exhaustive or to limit the invention to the precise forms disclosed. It will be apparent to one of ordinary skill in the art that many modifications and variations are possible in view of the above teachings.

What is claimed is:

1. An electronic device comprising:
   a housing; and
   a vibration device coupled to the housing and comprising:
      a structure defining a length that extends between a first end fixed with respect to the housing and a second end that is distal from the first end;
      a first actuator coupled to the housing and positioned beneath the structure at a first distance from the first end along the length of the structure and configured to apply a first actuator force to the structure; and
      a second actuator coupled to the housing and positioned beneath the structure at a second distance from the first end along the length of the structure, the second distance being different from the first distance, the second actuator configured to apply a second actuator force to the structure; wherein:
         the first actuator force produces a first haptic output at a top surface of the structure; and
         the second actuator force produces a second haptic output at the top surface of the structure that is different from the first haptic output.

2. The electronic device of claim 1, wherein:
   the first haptic output corresponds to a first displacement of the second end of the structure; and
   the second haptic output corresponds to a second displacement of the second end of the structure that is different than the first displacement.

3. The electronic device of claim 1, wherein the first and second actuator forces are substantially equal in magnitude.

4. The electronic device of claim 1, further comprising a stiffener positioned above and attached to the structure.

5. The electronic device of claim 4, wherein the stiffener is configured to provide support for an unsupported portion of the structure.

6. The electronic device of claim 1, further comprising a third actuator coupled to the housing and positioned beneath the structure at a third distance from the first end along the length of the structure, the third distance being different from the first and second distances from the first end, the third actuator configured to apply a third actuator force to the structure.

7. The electronic device of claim 6, wherein the third actuator force produces a third haptic output at a top surface of the structure.

8. A vibration device comprising:
   a stiffener defining a length that extends between a first fixed end and a second end opposite the first end;
   a first actuator positioned along the stiffener at a first distance from the first end along the length of the stiffener and configured to apply a first actuator force to the stiffener; and
   a second actuator positioned along the stiffener at a second distance from the first end along the length of the stiffener, the first distance being different than the second distance, the second actuator configured to apply a second actuator force to the stiffener; wherein:
      the first actuator force is configured to produce a first displacement of the second end of the stiffener; and
      the second actuator force is configured to produce a second displacement of the second end of the stiffener that is different from the first displacement.

9. The vibration device of claim 8, wherein:
   the first displacement produces a first haptic output at the top surface of the stiffener; and
   the second displacement produces a second haptic output at the top surface of the stiffener.

10. The vibration device of claim 8, wherein the first and second actuator forces are substantially equal in magnitude.

11. The vibration device of claim 8, wherein the first fixed end is coupled to a device housing of an electronic device.

12. The vibration device of claim 8, further comprising a structure positioned between the stiffener and the first and second actuators.

13. The vibration device of claim 8, further comprising a vibratory mass coupled to the stiffener.

14. The vibration device of claim 13, wherein the vibratory mass is coupled to the second end of the stiffener.

15. The vibration device of claim 8, wherein the first actuator force is greater than the second actuator force.

16. A vibration device comprising:
   a structure having a length that is defined between a first fixed end and a second end opposite the first end;
   a stiffener positioned above and attached to the structure and defining a top surface;

a first actuator positioned and beneath the structure at a first distance from the first end along the length of the structure and configured to apply a first actuator force to the structure; and a second actuator positioned beneath the structure at a second distance from the first end along the length of the structure and configured to apply a second actuator force to the structure; wherein:

the first distance is different than the second distance;

the first actuator force corresponds to a first haptic output; and the second actuator force corresponds to a second haptic output different from the first haptic output.

17. The vibration device of claim 16, wherein the first and second actuator forces are equal in magnitude.

18. The vibration device of claim 16, further comprising a third actuator positioned beneath the structure at a third distance from the first end along the length of the structure and configured to apply a third actuator force to the structure.

19. The vibration device of claim 18, wherein:

the third actuator force is equal in magnitude to at least one of the first and second actuator force; and the third actuator force corresponds to a third haptic output that is different from the first and second haptic outputs.

20. The vibration device of claim 16, wherein:

the first actuator force produces a first displacement of the second end of the structure; and the second actuator force produces a second displacement of the second end of the structure.

* * * * *